United States Patent [19]

Imlig et al.

[11] Patent Number: 5,163,222

[45] Date of Patent: Nov. 17, 1992

[54] METHOD AND APPARATUS FOR LOADING METAL LEADFRAMES WITH ELECTRONIC COMPONENTS

[75] Inventors: Martin Imlig, Oberarth; Andreas Steiger, Zug, both of Switzerland

[73] Assignee: Esec, SA, Cham, Switzerland

[21] Appl. No.: 702,367

[22] Filed: May 15, 1991

Related U.S. Application Data

[63] Continuation of Ser. No. 584,408, Sep. 14, 1990, abandoned, which is a continuation of Ser. No. 315,001, Feb. 24, 1989, abandoned.

[30] Foreign Application Priority Data

Feb. 26, 1988 [CH] Switzerland ............................ 722/88
Feb. 26, 1988 [CH] Switzerland ............................ 723/88

[51] Int. Cl.$^5$ ........................ H01R 43/00; B23P 23/00
[52] U.S. Cl. ........................ 29/827; 29/564; 29/564.1; 29/564.6; 29/711; 29/712; 198/345.2; 198/456
[58] Field of Search ................... 29/564, 564.1, 564.6, 29/711, 712, 827; 198/345, 456

[56] References Cited

U.S. PATENT DOCUMENTS 3,627,190 12/1971 Ramsey .
4,177,554 11/1979 Deveres et al. .
4,674,670 6/1987 Watanabe et al. .

FOREIGN PATENT DOCUMENTS

423397 4/1967 Switzerland .

Primary Examiner—Carl J. Arbes
Attorney, Agent, or Firm—Egli International

[57] ABSTRACT

A method and apparatus for transferring relatively thin, strip-like workpieces, such as metal leadframe strips to at least one processing or bonding station are proposed. The apparatus essentially comprises a transfer mechanism, a processing or bonding station, an electromotive drive, a first and a second group of electromagnetically, pneumatically or hydraulically operable clamping elements. The first group of the clamping elements is movable relative to the second group of clamping elements fixed to a main carrier of the transfer mechanism. In a first phase of the transfer and feed movement, the electromotive drive is controlled by means of reference geometry data given in dependence upon a particular leadframe and in a second phase of the feed movement by means of dynamic, opto-electronically measured reference data and pulses formed therefrom. The supply movement of the leadframe to the processing or bonding station takes place in a transfer direction (X') at an angle (α) displaced in a side and plane relative to the main carrier.

22 Claims, 6 Drawing Sheets

METHOD AND APPARATUS FOR LOADING METAL LEADFRAMES WITH ELECTRONIC COMPONENTS

This is a continuation of copending application Ser. No. 584,408, filed on Sep. 14, 1990, now abandoned which itself is a continuation of Ser. No. 315,001, filed Feb. 24, 1989, now abandoned.

BACKGROUND OF THE INVENTION

The present invention relates to a method and an apparatus for supplying and loading strip-like workpieces, such as leadframe strips, with electronic components or the like. The leadframe strips are moved by a transfer mechanism provided with clamping elements to an associated processing or bonding station, in which electrical circuits and/or electronic components, such as chips or the like located at the process point of the leadframe are bonded to the latter.

With automating movement and processing sequences, particularly in conjunction with an apparatus constructed for the transfer or transportation of relatively thin (approximately 0.1 to approximately 2.0 mm) leadframe strips, the problem exists that the individual leadframes for the application of electronic components for forming or bonding integrated circuits must be supplied to a processing or bonding station or the like in a positionally stable manner and be precisely aligned with tolerances in the range of microns.

SUMMARY OF THE INVENTION

It is an object of the invention to provide a method and an apparatus for performing the method which would permit a precisely aligned or oriented transfer, e.g. a cyclic transfer of leadframes of different types, as well as their supply to a processing or bonding station correspondingly arranged in the passage direction and without additional conversion or handling measures.

This and other objects of the invention are attained by a method for loading leadframes with electronic components, in which:
  a) the individual leadframes are supplied to a transfer mechanism provided with a first group of mobile clamping elements and a second group of fixed clamping elements,
  b) the mobile clamping elements transferring the leadframes to the processing or bonding station are operatively connected by means of a guide unit and a carrier member to an electromotive drive,
  c) the electromotive drive is controlled in a first phase by data for the advance to the processing or bonding station forming a reference geometry dependent on the particular leadframe and related to the process point and a reference hole or the like,
  d) during the transfer movement the reference geometries of the individual leadframes are dynamically and opto-electronically measured, and
  e) in a second phase corresponding pulses are formed from the determined data for controlling the electromotive drive.

The objects of the present invention are also attained by an apparatus for performing the method, comprising a device for transferring leadframes to at least one correspondingly associated processing or bonding station for bonding electrical circuits and/or electronic components located at the process point of the individual leadframes. The apparatus further comprises the following members:
  a) a first and a second group of clamping elements, the first group of clamping elements being displaceable in the transfer direction relative to the second group of fixed clamping elements,
  b) an electromotive drive and a guide unit operatively connected thereto for the substantially linearly oriented transfer of the leadframes to the processing or bonding station,
  c) a sensor for the dynamic measurement of the reference geometries of the particular leadframes,
  d) a computer for converting the values determined by the sensor into corresponding signals,
  e) an actuator for using the signals and controlling the electromotive drive for the linearly oriented transfer movement, and
  f) a position checking and control unit for determining the instantaneous position of the linearly adjustable elements for forming a comparison result and for controlling the electromotive drive.

Further features of the invention can be gathered from the following description in conjunction with the drawings and claims. The invention is described in greater detail hereinafter relative to the drawings.

DETAILED DESCRIPTION OF THE PREFERRED EMBODIMENTS

A. General Description of Invention

Figures 1, 1A:
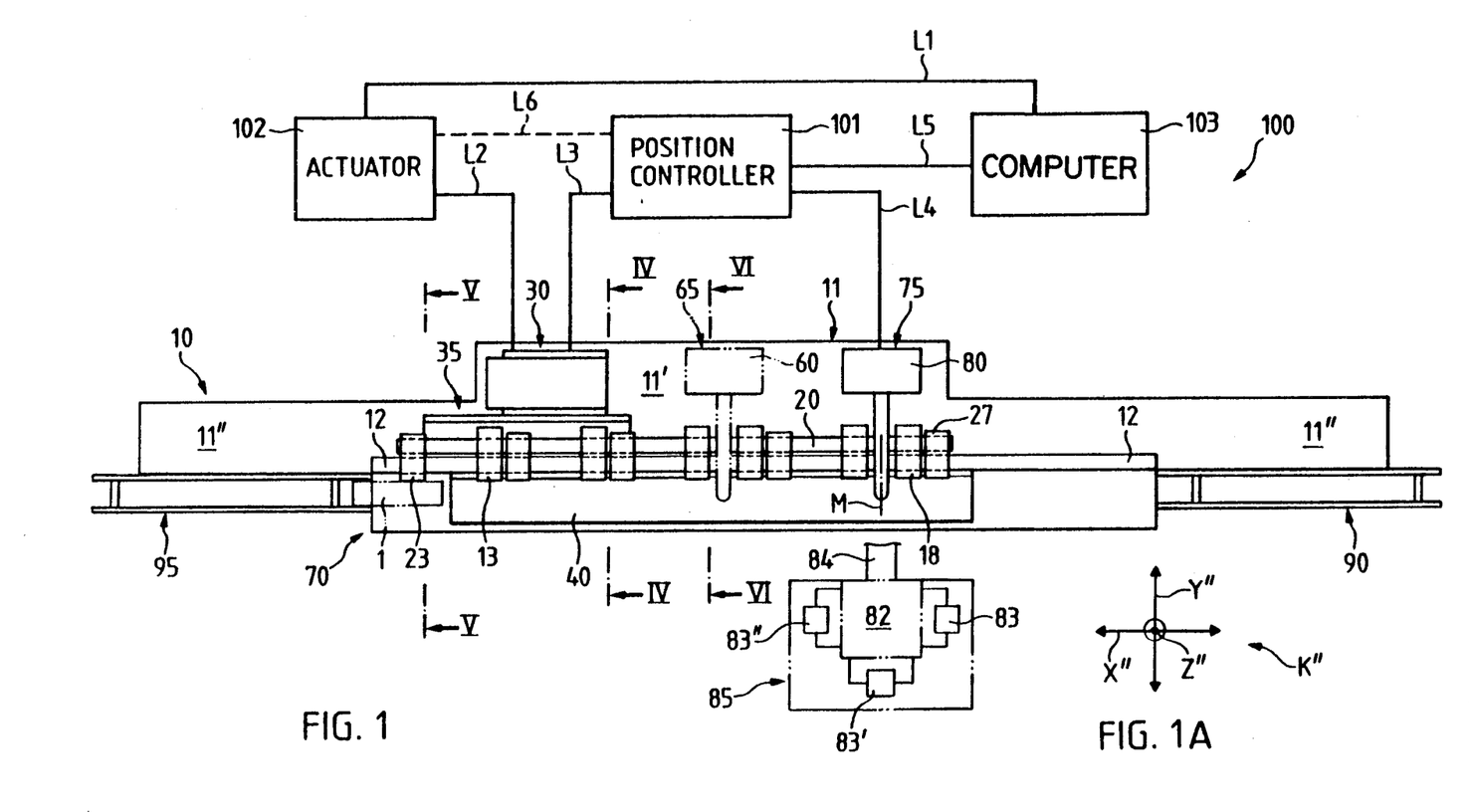
FIG. 1 is a diagrammatically shown plan view of an apparatus for supplying strip-like workpieces to a processing or bonding station in a first position.
FIG. 1a diagrammatically shows the coordinate system of movement directions.
Figure 2:
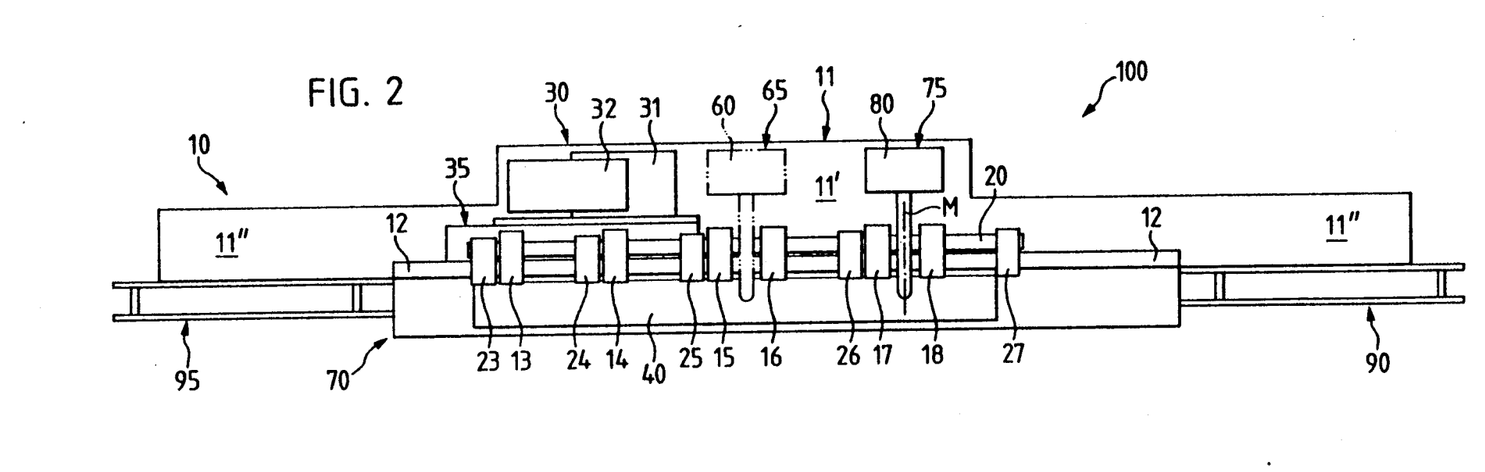
FIG. 2 is a plan view of the apparatus according to FIG. 1 in a second position.

FIGS. 1 and 2 show in general survey form an apparatus 100 diagrammatically and in plan view. Apparatus 100 inter alia comprising a correspondingly constructed and associated transfer mechanism 70 is constructed for supplying strip-like workpieces to at least one processing or bonding station 75 associated with transfer mechanism 70. Station 75 is provided with a measuring member, e.g. a diagrammatically represented, optical sensor 80.

During the supply movement, the individual workpiece is in a first phase supplied cyclically and roughly along a coordinate of arrow direction X of a diagrammatically represented coordinate system K (FIG. 3a) and in a second phase along the coordinate of arrow direction X' to the processing or bonding station 75, or respectively the optical sensor 80. In a preferred embodiment, the workpiece can be oriented in a third phase in accordance with a coordinate designated by the arrow direction Y (FIG. 3a), coordinate Y being oriented in the plane roughly at right angles to coordinate X. The means for performing the supply movement in arrow direction X' and the orientation movement in arrow direction Y will be described hereinafter.

Figure 7:
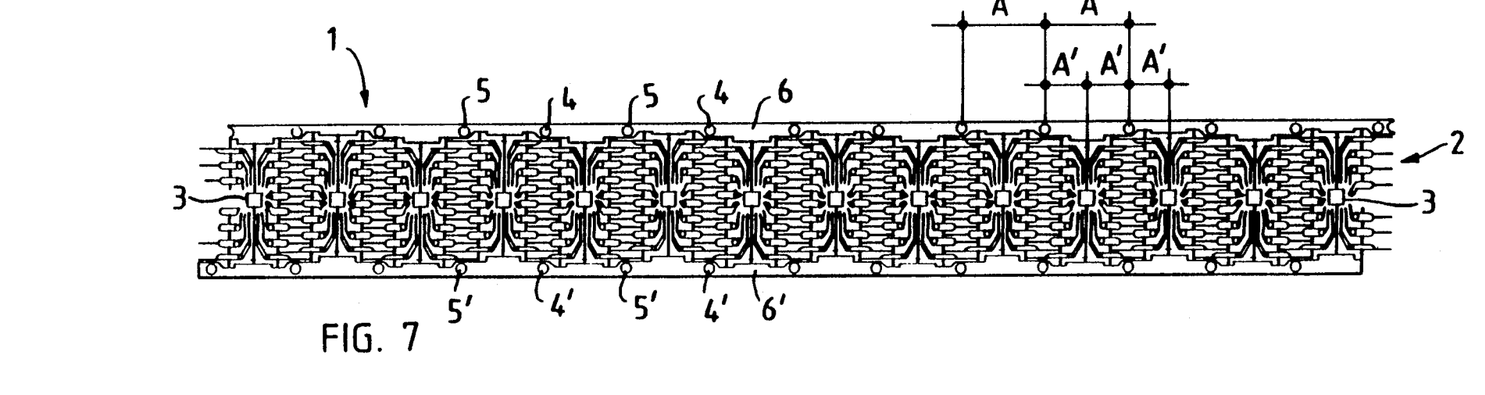
FIG. 7 shows a portion of the strip-like workpiece.

In the case of the workpiece, the portion of which is diagrammatically shown in FIG. 7, which is e.g. a so-called, known per se, metal leadframe (strip) with e.g. multipolar surface structure 2 and with several series-arranged supporting surfaces 3 or recesses (process points) for the automatic fixing and contacting of not shown, electronic components, such as chips or the like, or for forming integrated circuits, the holes 4, 5 or 4', 5', arranged at specific intervals A on the lateral edges 6,6' of strip 1 during the production of such leadframes or strips, have a specific spacing A' from the supporting surface 3. Holes 4, 5 or 4', 5' in conjunction with the inventive apparatus 100, are used as a reference geometry during the supply movement to the processing or bonding station 75 in the direction of arrow X'. The leadframe 1 shown in FIG. 7 is one of preferred embodiments; it is also possible to use other configurations with corresponding reference geometries. The actual positioning function of the leadframe will be described in greater detail hereinafter in conjunction with the operation of apparatus 100.

Apparatus 100 shown in plan view in FIG. 1 comprises in the passage direction, in accordance with arrow direction X, X' (FIG. 3a) a discharge device 95 for the unloaded workpieces or leadframes 1 arranged at one end, a reception device 90 at the other end for the leadframes 1 loaded with not specified electronic components in the apparatus, as well as the transfer mechanism 70 located between the two devices 95 and 90. The diagrammatically shown discharge and reception devices 95, 90 are e.g. constructed as magazines for the superimposed discharge and reception, respectively of the individual leadframes 1. Other constructions of the discharge and reception devices 95, 90 than magazines are also possible, but these devices do not form part of the invention and are consequently not described.

With apparatus 100 can be associated a device 85 provided with suitable electromotive drives 83, 83', 83" diagrammatically shown in FIG. 1. Device 85 is constructed for performing the in-feed of a bonding head 84, which is partly and diagrammatically shown and arranged on a carrier part 82, to the leadframes 1 supplied to the processing or bonding station 75 by the transfer mechanism 70. The in-feed of the carrier part 82 takes place in accordance with the coordinate system K" shown in FIG. 1a in arrow direction X" and arrow direction Y'", the in-feed of the partly shown bonding head 84 taking place in arrow direction Y" and orthogonally thereto in arrow direction Z".

Figures 3, 3A:
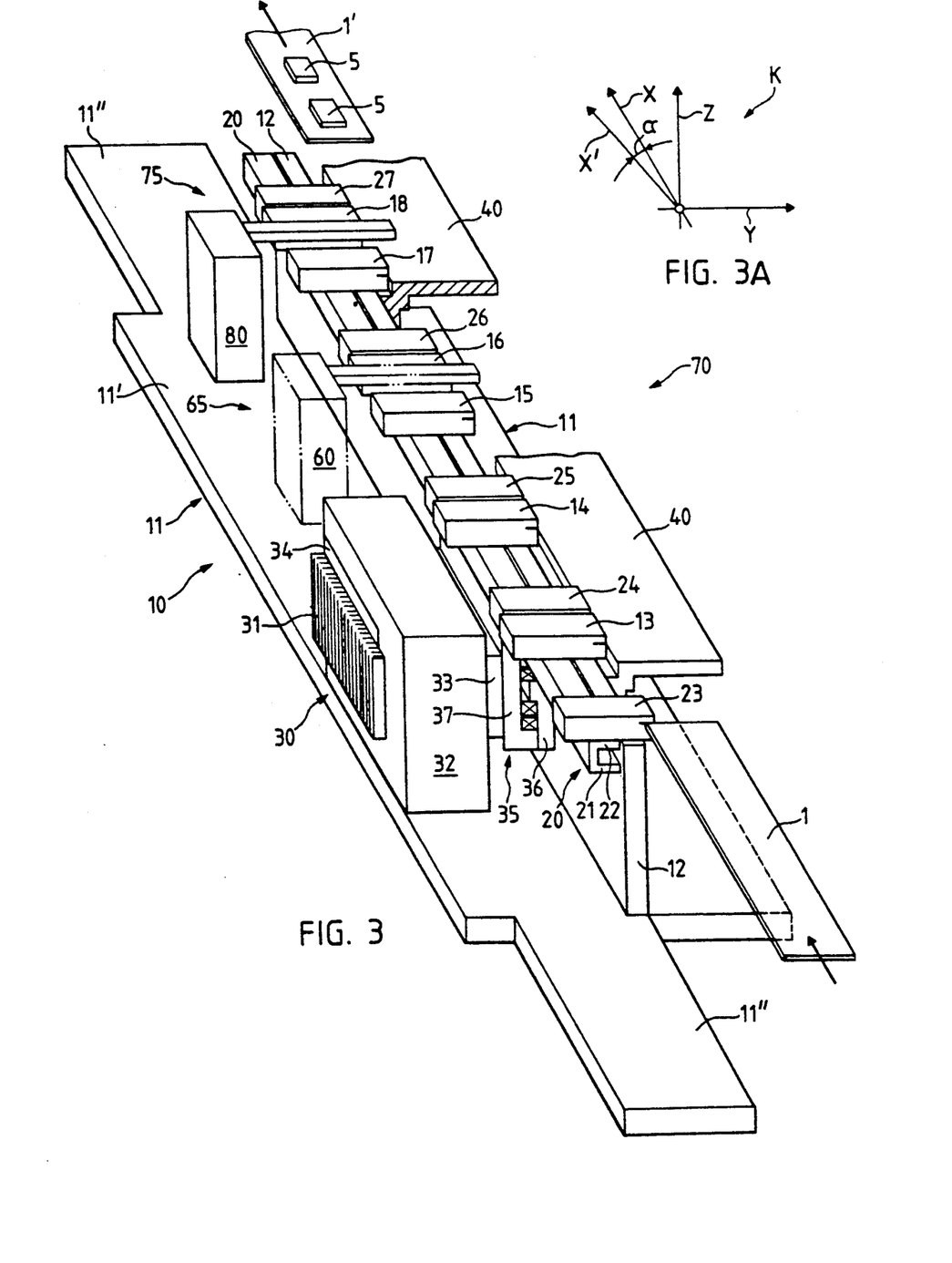
FIG. 3 is a diagrammatically shown perspective view of a portion of the apparatus according to FIG. 1.
FIG. 3a is a diagrammatically represented coordinate system illustrating moving directions in the apparatus.

As diagrammatically shown in FIGS. 1 and 2 and on a larger scale in FIG. 3, the transfer mechanism 70 comprises a main carrier 10 oriented in the longitudinal direction which essentially corresponds to the transfer direction, a carrier member 20, a guide unit 35 and an electromotive drive 30 operatively connected to guide unit 35. Elements 10, 20, 30 and 35 will be described in detail hereinafter.

B. Specific Description of Invention

The main carrier 10 essentially comprises a baseplate 11 and a web 12. As is more clearly shown in FIG. 3, the baseplate 11 is provided with an e.g. wider middle part 11', to which are longitudinally connected at both ends portions 11". In the vicinity of middle part 11', is provided the web 12 at right angles to baseplate 11 which is fixed by not shown means. On web 12 are e.g. provided a plurality of fixed, spaced clamping elements 13, 14, 15, 16, 17 and 18. The main carrier 10 which is constructed as an inverted T-shaped member in cross section, comprises baseplate 11 and web 12 which can also be constructed in one piece.

Figure 5:
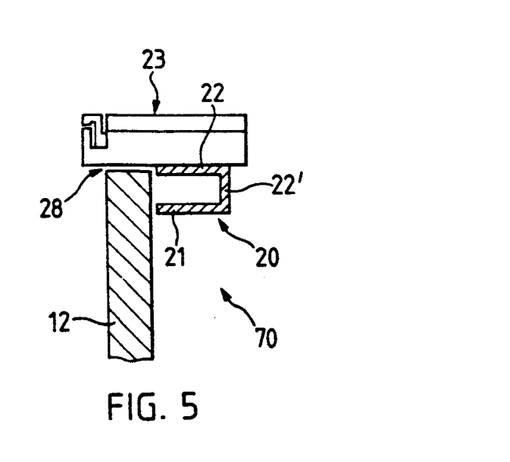
FIG. 5 is a partial sectional view of a portion of the apparatus along line V—V in FIG. 1.
Figure 6:
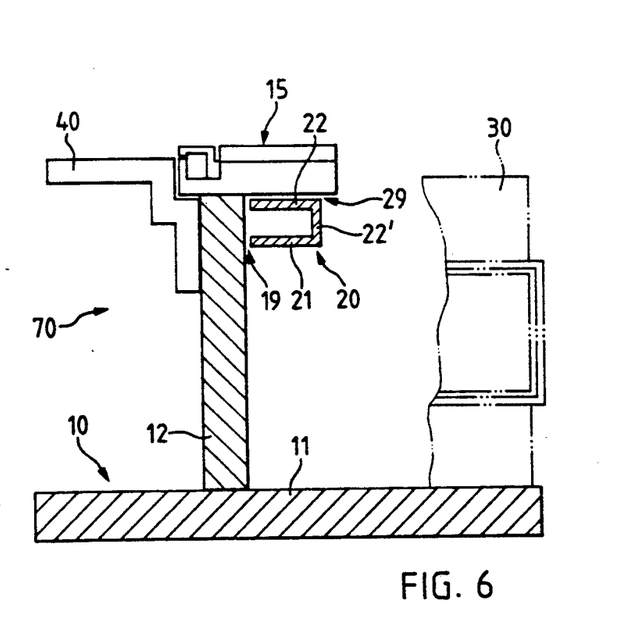
FIG. 6 is a section through the apparatus along line VI—VI in FIG. 1.

The carrier member 20 operatively connected to guide unit 35, e.g. has an approximately U-shaped profile cross-section with two approximately parallel flanges 21, 22 and a vertical web 22' interconnecting flanges 21, 22 (FIGS. 5 and 6). On the upper flange 22, are arranged in spaced manner, as diagrammatically shown in FIGS. 1 and 2, clamping elements 23, 24, 25, 26 and 27 adjustable or displaceable together with the carrier member 20 relative to the fixed clamping elements 13 to 18 located on web 12. Carrier member 20 with clamping elements 23 to 27 fixed thereto or thereon and, as indicated in the coordinate system K in FIG. 3a with arrow direction X' (transfer direction), is adjustable or displaceable under an extremely acute angle α with respect to the coordinate designated by arrow direction X. Clamping elements 13 to 18 fixed on web 12 of main carrier 10 are located in the coordinate designated with arrow direction X.

Clamping elements 23 to 27 operatively connected to the carrier member 20 will be referred to hereinafter as a first group of clamping elements while clamping elements 13 to 18 fixed to web 12 of main carrier 10 will be subsequently referred to as a second group of clamping elements. The number of elements in the two clamping element groups is variable and can be adapted to the requirements made to apparatus 100. The individual clamping elements 23 to 27 of the first group and the clamping elements 13 to 18 of the second group are hydraulically, pneumatically or electromagnetically operable by means of a corresponding, associated energy source.

The specific movement pattern of the first group of clamping elements 23 to 27 relative to the second group of clamping elements 13 to 18 in connection with the operation of the complete apparatus 100 will be described subsequently.

FIG. 5 shows in a sectional view along line V—V in FIG. 1, a part of the transfer mechanism 70. It is possible to see the web 12, as well as the carrier member 20 comprising two flanges 21, 22 and the web 22' and the clamping element 23 of the first group of clamping elements 23 to 27 arranged on the carrier member 20 at this point and fixed to flange 22 by not shown but any suitable means. For the free (contactless), linear transfer movement in arrow direction X' of the first group of clamping elements 23 to 27, as shown in an exemplified manner in FIG. 5, an adequate gap 28 is provided between web 12 and the lower face of the individual clamping element 23 to 27 facing web 12.

FIG. 6 shows in sectional view along line VI—VI of FIG. 1, the transfer mechanism 70 and it is possible to see the main carrier 10 with the baseplate 11 and the web 12, the carrier member 20 with the gap 19 with respect to web 12 and the clamping element 15 of the second group of clamping elements 13 to 18 arranged at this point on web 12 and fixed thereto by not shown means. For the linear movement of carrier member 20 in arrow direction X', a gap 29 is provided between the fixed clamping elements 13 to 18 and carrier member 20. FIG. 6 also shows a supporting element 40 detachably fixed to web 12 by not shown means, as well as an electromotive drive 30, partly shown by dot-dash lines and located on the other side.

As is partly shown in FIG. 3, the electromotive drive 30 has a stator body 32 having an approximately E-shaped profile cross-section and fixed by not shown means to the middle part 11' of baseplate 11 of main carrier 10 and correspondingly arranged magnet parts 34, 34' (only magnet part 34 is visible), as well as a coil member guided in the stator body 32 and which is fixed by not shown means to a mounting plate 33 operatively connected to the guide unit 35. The individual parts 31, 32 and 34, 34' of drive 30 are so constructed and reciprocally arranged that through a corresponding excitation, preferably by a controlled or regulated direct current excitation of the coil body 31, there is a movement of the latter together with the mounting plate 33 in arrow direction X and, additionally, through the special construction of parts 31, 32, also a movement roughly in arrow direction Y.

Figure 4:
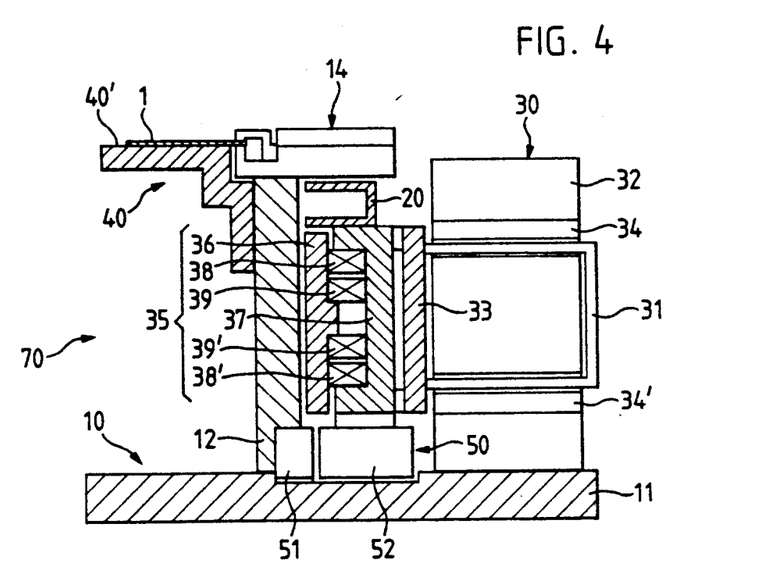
FIG. 4 is a section through the apparatus along line IV—IV in FIG. 1.

FIG. 4 shows a section along line IV—IV in FIG. 1, and it is possible to see the guide unit 35, with the electromotive drive 30 essentially comprising parts 31, 32 and 34, 34', the carrier member 20, main carrier 10 with the laterally arranged supporting element 40 fixed by not shown fixing means to web 12 and clamping element 14 of the second, fixed group of clamping elements 13 to 18 arranged at this point and fixed to web 12. The supporting element 40 is so arranged and fixed on web 12 of main carrier 10, that the leadframe 1 held by the clamping element 14 is at a small spacing in the range of microns from the surface 40' of the supporting element 40. Particularly in the vicinity of the bonding station, supporting element 40 serves as an abutment for the leadframe 1, e.g. during bonding.

The guide unit 35 comprises a first bearing element 36 and a second bearing element 37 spaced therefrom. Between two plate-like bearing elements 36, 37, are arranged corresponding sliding elements 38, 38' and 39, 39', e.g. known per se roller bearing fitted in a roller cage. The first bearing element 36 is fixed by not shown means to web 12 of main carrier 10, and to the second bearing element 37 is fixed the carrier element 20 and the mounting plate 33 operatively connected to the coil member 31 of the electromotive drive 30.

To obtain the supply of the carrier member 20 with the first group of clamping elements 23 to 27 arranged thereon designated by arrow direction X', e.g. one bearing element 36 can be arranged with not shown means in accordance with the extreme acute angle $\alpha$ on web 12 of main carrier 10. In another embodiment, the roller bearing path of bearing element 36 can be provided with a corresponding angle $\alpha$. It is important that guide unit 35 is constructed for achieving the supply movement oriented in arrow direction X', thereby permitting a substantially horizontal relative movement of bearing element 37 with carrier member 20 and the first group of clamping elements 23 to 27 to the second group of clamping elements 24 to 27 arranged on web 12.

For determining the instantaneous position of parts 37, 33 and 31 adjustable by means of drive 30 in arrow direction X' with respect to web 12 of fixed main carrier 10, there is provided in the vicinity of guide unit 35 and drive 30 a correspondingly constructed measuring device 50, which is shown in FIG. 4 and by means of which, depending on a result, e.g. a comparison result, the electromotive drive, is e.g. operated by a direct current excitation pulse. Measuring device 50 comprises two correspondingly arranged measuring elements 51, 52 with not shown measuring heads and correspondingly associated glass measuring scales, which are provided with line units oriented in the X' direction. By means of the e.g. opto-electronically operated measuring heads, position-dependent data are determined and converted into signals, the latter being supplied to the electromotive drive or a corresponding, not shown control mechanism.

Figure 11:
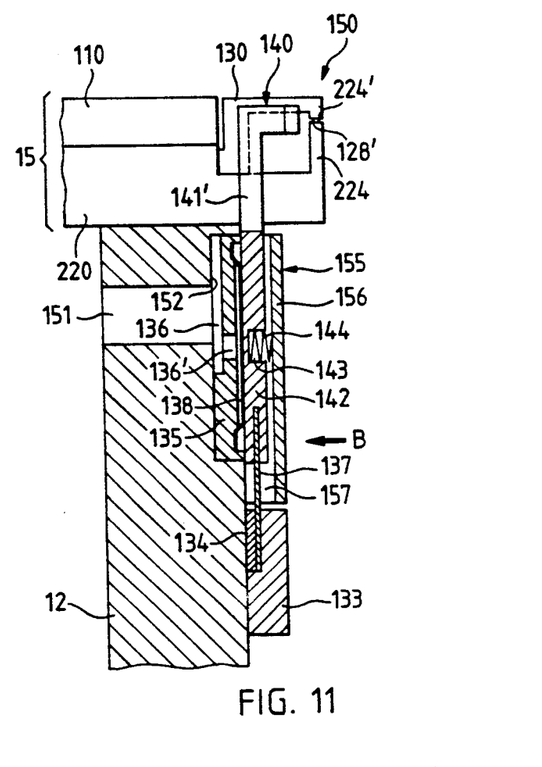
FIG. 11 is an elevation view, partially in section, of a positioning device associated with the individual clamping element according to FIG. 10.
Figure 12:
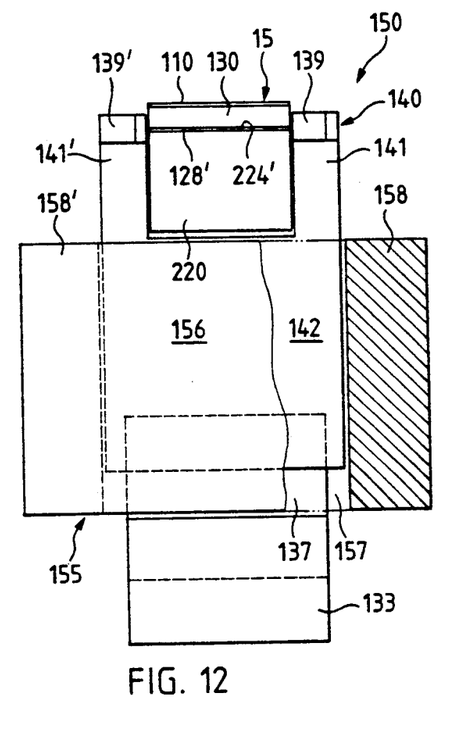
FIG. 12 is a view on a positioning device for the clamping element according to FIG. 10 in arrow direction B of FIG. 11.
Figure 13:
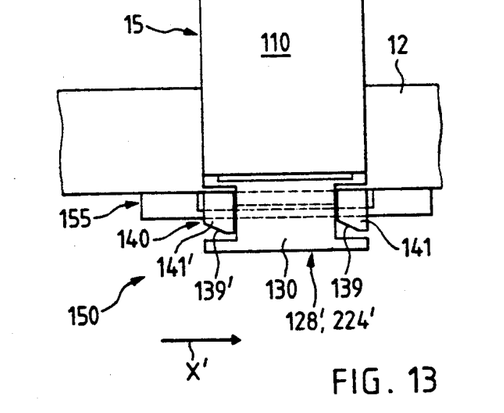
FIG. 13 is a plan view of the positioning device shown in FIG. 11, on a smaller scale.

In an embodiment of the transfer mechanism 70 with at least one of the fixed clamping elements 13 to 18 there is provided a correspondingly constructed positioning element 150 for orienting the leadframe 1, as shown in FIGS. 11 to 13. During the supply of the leadframe 1 to processing or bonding station 75, or to further processing stations located before or after bonding station 75 in the passage direction, the positioning element 150 simultaneously performs an orientation movement roughly at right angles to transfer direction X and as represented in coordinate system K in FIG. 3a by arrow direction Y. For achieving an optimum orientation or alignment of the leadframe 1, a positioning element 150 is associated with each fixed clamping element 13 to 18.

The special construction of the individual clamping elements will be described relative to FIGS. 8 to 10. As an embodiment of the fixed clamping elements 13 to 18, clamping element 15 is shown on a larger scale and in sectional view in FIG. 10, and it is possible to see the first casing part 110, which has a casing wall 113, in which is provided on the inside facing one clamping member 130, a substantially pocket-like depression 112 for an intermediate piece 115. A correspondingly constructed opening 111 is provided at one end of casing part 110 for connecting a medium supply line.

The intermediate piece 115 arranged in depression 112 of casing part 110 has a hole 116' passing through the intermediate piece 115 and a channel 116, which is connected by means of a hold 111' in casing part 110 to opening 111. On the side facing the clamping member 130, a first membrane part 118 is arranged on intermediate piece 115. Membrane part 118 is located in a recess or depression formed in intermediate piece 115 and held there with not shown means.

Figure 10:
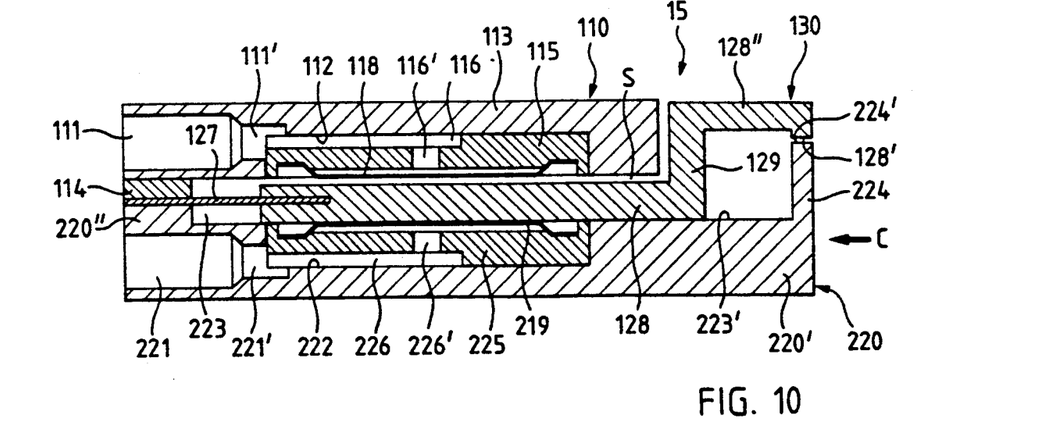
FIG. 10 is a sectional view of a clamping element of a second group of clamping elements for the apparatus according to FIG. 1, shown on a larger scale.

As further seen in FIG. 10, a second casing part 220 of a clamping element 15 has a base 220', in which is provided a first recess or depression 223 and a second recess or depression 222. In the second, pocket-like depression 222 there is provided a second intermediate piece 225 having a channel 226 and a hole 226'. Channel 226 is connected to a correspondingly associated opening 221 by means of a hole 221' on one side of the casing part 220. Like opening 111 in casing part 110, opening 221 is constructed for the connection of the medium line. On the other side of the casing part 220 facing opening 221, is provided a web 224, which is constructed on the side facing the clamping member 130 as a first, diagrammatically shown clamping face 224'. On the side facing clamping member 130, a second membrane part 219 is associated with intermediate piece 225. Membrane part 219 is also arranged in a recess or depression formed in intermediate piece 225 and is held there by not shown means.

The clamping member 130 arranged between the two casing parts 110 and 220 has a first leg 128 resting on the surface 223' of base 220', an approximately vertical web 129 shaped onto one end of leg 128 and a second leg 128" shaped onto web 129. In the front region, the second leg 128" is provided with a second clamping face 128', which corresponds to the first clamping face 224' arranged on web 224 of casing part 220. On the other end of leg 128' is arranged a spring element 127, e.g. a springy sheet metal strip or the like, which is fixed in not shown manner to leg 128. The free end of spring element 127 rests on a portion 220" of casing part 220 and by the association of a correspondingly constructed clamping part 114 is fixed between the two casing parts 110, 220 interconnected by a not shown screw connection.

By using suitable means, e.g. by parts 118, 219 as, or by not shown, bellows-like pressure means, the clamping member 130 is movable in freely raisable manner in the clamping movement direction between two casing parts 110, 220 spaced-apart or within a reciprocal gap S in the front region. Thus, two clamping faces 224' and 128' are pressed together by a corresponding, pneumatic or hydraulic actuation of the clamping member 130 for holding the metal leadframe 1 or are pressed apart for releasing the latter.

Figure 8:
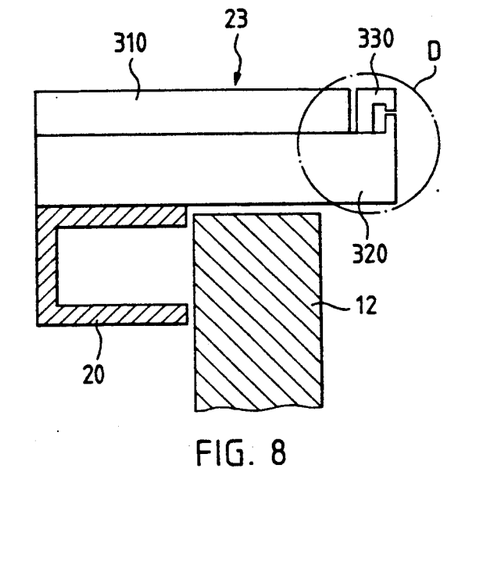
FIG. 8 is a partially sectional view of a clamping element, shown on a larger scale, of a first group of clamping elements for the apparatus according to FIG. 1.

FIG. 8 shows as an embodiment of the first movable group of clamping elements 23 to 27, the clamping element 23 and it is possible to see a first casing part 310, a second casing part 320 and a clamping member 330. Differing from the previously described clamping element 15, clamping element 23 is detachably fixed by not shown means to the carrier member 20 movable in arrow direction X'. The construction of clamping element 23 according to FIG. 8 essentially corresponds to that of clamping element 15 described relative to FIG. 10, so that all that will be described here consists of the constructional differences of clamping element 23 in the front area compared with clamping element 15.

Figure 9:
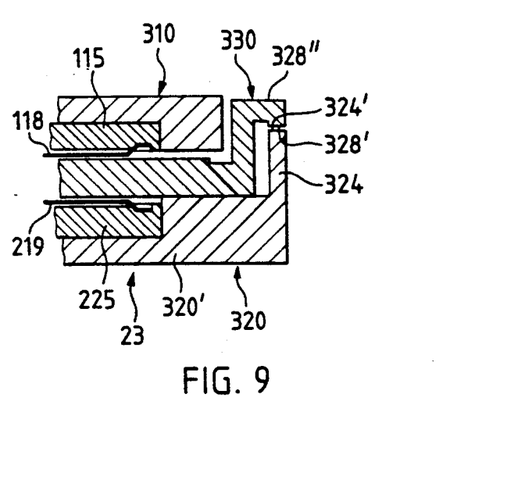
FIG. 9 is a sectional view of a detail of the front area of the clamping element according to FIG. 8 indicated by the circle D.

FIG. 9 shows in a sectional view and on a larger scale the front area of clamping element 23 designated by circle D in FIG. 8, and it is possible to see the first casing part 310 with the intermediate piece 115 arranged therein and the associated membrane part 118, the second casing part 320 with the intermediate piece 225 arranged therein and the associated membrane part 219, as well as the clamping member 330 positioned between the two casing parts 310 and 320 interconnected by a non-shown screw connection. Diverging from the clamping element 15, in this embodiment the leg 328" of clamping member 330 and correspondingly the base 320' of casing part 320 are shorter. FIG. 9 also shows web 324 with the clamping face 324' of casing part 320 and the corresponding clamping face 328 arranged on leg 328" of clamping member 330.

The structural difference between the first group of clamping elements 23 to 27 and the second group of clamping elements 13 to 18 essentially based on the operational requirements consists in the fixed clamping elements 13 to 18 being supplied with the leadframes 1 by the mobile clamping elements 23 to 27 deliberately and intentionally in an inclined position according to arrow direction X' displaced by a small angle α in the range of several microns in the side plane, whilst being aligned by means of the positioning device 150 associated with the fixed clamping elements 13 to 18.

In a preferred embodiment, the positioning device 150 is associated with the fixed clamping elements 13 to 18 and this will now be described in connection with FIGS. 11 to 13. Positioning device 150 is shown in a sectional view in FIG. 11, and it is possible to see the clamping element detachably fixed by a not shown screw connection to web 12 of main carrier 10 together with the two partly represented casing parts 110, 220 and the clamping member 130. Positioning device 150 essentially comprises a positioning element 140, a holding part 155, an intermediate piece 135 with associated membrane part 138, a spring element 137 and a holding piece 133. The membrane-like pressure element 138 shown in FIG. 11 can also be constructed in bellows-like, not shown manner.

The positioning element 140 has a plate-like portion 142, to the one end of which is fixed the spring element 137 e.g. a comprising springy sheet metal strip or the like, not shown fixing means being used. The spring element 137 resting on a correspondingly associated intermediate piece 134 (FIG. 11) and operatively connected to the positioning element 140 is detachably fixed to web 12 of main carrier 10 by means of holding piece 133 and a not shown screw connection. On one end of the roughly fork-like positioning element 140 are provided two spaced legs 141, 141' between which and as shown in FIG. 12 is located the clamping element 15. In the upper region, a sliding face 139 is provided on leg 141 and a sliding face 139' on leg 141', the two sliding faces 139, 139' having a ski-like constructions.

The holding part 155 which is approximately C-shaped in profile cross-section and in plan view (FIG. 13) has a front plate 156, two spaced webs 158, 158' and a recess 157 between two webs 158, 158'. In the partly-broken-away broken-away front view of FIG. 12, in the arrow direction, is shown the portion 142 of positioning element 140 positioned between webs 158, 158' in recess 157 and it is also possible to see the spring element 137 and holding piece 133. A compression spring 144 is positioned and held by not shown means on the inside of front plate 156. The compression spring 144 is located with the free end in a recess 143 of portion 142 and essentially acts on the positioning element 140. The holding part 155 is preferably constructed in one piece and is detachably fixed by means of a not shown screw connection to the web 12 of main carrier 10.

As shown in FIG. 11, in web 12 there is provided a pocket-like recess 152, in which is arranged the intermediate piece 135 having a channel 136 and a hole 136'. Channel 136 is connected to a hole 151 in web 12 and hole 151 is constructed thereto for the connection of a not shown medium supply line. On the side facing portion 142 membrane part 138 is arranged and held by not shown means in a recess of intermediate piece 135.

FIG. 12 shows the positioning device 150 in partly broken-away form and in accordance with arrow direction B (FIG. 11), and it is possible to see the clamping element 15 located between the two webs 141, 141', portion 142 of positioning element 140 arranged between the two webs 158, 158' of holding part 155 in recess 157 and holding piece 133 fixed by not shown means to web 12 of the main carrier 10.

FIG. 13 shows in plan view and on a smaller scale the positioning device 150, and it is possible to see holding part 155, web 12 with the clamping element 15 arranged thereon and which with the clamping member 150 is located between the two ski-like webs 141, 141' of positioning element 140. Clamping face 128' of clamping member 130 and the corresponding clamping face 224' of casing part 220 have, as shown in FIG. 13, and considered in the transfer direction X', roughly the same width as the external dimension of the two spaced webs 141, 141' of positioning element 140 provided with the sliding faces 139, 139'.

Figure 14:
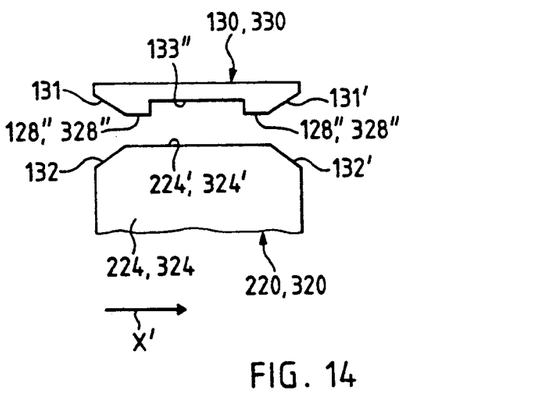
FIG. 14 is a front view according to arrow direction C in FIG. 10 of a modified clamping element with the corresponding associated clamping faces of the clamping elements.

FIG. 14 illustrates in the front view according to arrow direction C in FIG. 10, a variant in which the clamping face 224', 324' have sliding skids 132, 132' shaped onto both sides and located on web 224, 324 of casing part 220, 320 and the corresponding clamping face of clamping member 130, 330. In this variant as considered in the transfer direction, the clamping face 128', 328' is subdivided by a recess 131" into two portions 128", 328" and has landing skids 13, 131' shaped onto both sides.

It is pointed out here that the membrane-like and preferred pneumatically or hydraulically controllable pressure elements 118, 219 and 138 of the clamping elements 23 to 27 and 13 to 18, as well as the positioning device 150 can be replaced by not shown, electromagnetic coil members, accompanied by a corresponding construction of the casing parts.

Referring back to FIG. 1, the operation of apparatus 100 will now be described in conjunction with control unit 101 (Position Controller), an actuator 102, a computer 103, corresponding lines L1, L2, L3, L4, L5 and L6, the aforementioned discharge device 95, transfer mechanism 70 and reception device 90 for the individual leadframes 1 to be loaded with corresponding electronic components.

The leadframes 1 arranged in superimposed relationship in the discharge device 95 are ejected individually in a first phase and e.g. in cyclically controlled manner by not shown but conventional rams or the like from the discharge device 95 and supplied by suitable, not shown means and preferably substantially aligned for the feed movement in arrow direction X to the first, movable clamping element 23 of the first group of clamping elements 23 to 27.

The leadframe 1 clamped and secured by the first clamping element 23 is now supplied cyclically and substantially by means of the guide unit 35 in arrow direction X', i.e. with respect to arrow direction X, in which the fixed clamping elements 13 to 18 are arranged, in the plane inclined by the angle α relative to direction X in arrow direction X' as diagrammatically represented in coordinate system K in FIG. 3a, to the second group of clamping elements 13 to 18.

During the cyclic supply movement of leadframe 1 in arrow direction X', the individual groups of clamping elements are successively correspondingly closed and reopened for clamping and releasing the leadframes 1 to be successively transferred in transfer and arrow direction X'.

The advance movement of the carrier member 20 operatively connected to the electromotive drive 30 and the first group of clamping elements 23 to 27 operatively connected thereto is directly associated with the spacings A between holes 4 and 5 or holes 4' and 5', or the spacings A' of holes 4' or 5' with respect to the supporting surface 3 (process point) of the leadframe 1 shown in exemplified manner in FIG. 7. The spacings A or A' with respect to the supporting or process face 3 are used as so-called reference geometries and are reference quantities dependent on the particular leadframe and as corresponding data for the control of drive 30 are fed into a corresponding associated actuator 102 or the like. Thus, the feed movement is adjustable on the basis of the design (hole spacing to the process point) of the particular leadframe 1 to be loaded with electronic components or the like, i.e. as a function of the particular hole spacings to the process point is preprogrammable in the actuator 102 operatively connected to drive 30. Thus, there is no longer any need for a time-consuming, manual action, as is required in comparable, known per se means.

In the aforementioned first phase, the clamping element 23 displaceable in arrow direction X' has the position diagrammatically shown in FIG. 1 with respect to the first, fixed clamping element 13 or the first group of clamping elements 23 to 27 with respect to the second group of clamping elements 13 to 18 and in that position, the individual clamping members of the first group of elements 23 to 27 are opened.

Subsequently clamping elements 23 to 27 of the first group acting in clamping manner on the lateral edge 6 or 6' on leadframe 1 (FIG. 7) is closed by any conventional not shown, for example, pneumatic means and the clamping elements 13 to 18 of the second group are opened. Roughly simultaneously the electromotive drive 30 for the transfer movement is correspondingly controlled in arrow direction X', so that the leadframe -1 is supplied to the first, fixed clamping element 13 in the not shown open position (clamping elements 13 to 18 are open). In the position bounded by the fixed clamping elements 13 to 18, the first group of clamping elements 23 to 27 operatively connected with carrier member 20 has the position shown in FIG. 2, in which the clamping elements 13 to 18 of the second group are closed and clamping elements 23 to 27 of the first group have opened again, so that by means of the drive 30, preferably constructed as a linear motor, the carrier member 20 with the clamping elements 23 to 27 fixed thereto can be returned to the basic position according to FIG. 1. The individual leadframes 1 are supplied, in the above-described manner, substantially stepwise or cyclically and controlled by corresponding means to the processing or bonding station 75.

The advance and transfer movement of leadframe 1 in arrow direction X' is sensed by means of sensor 80, which is arranged with its measuring axis M in the passage or arrow direction X' and spaced upstream of the actual process or operating point (bonding point). The reference geometry (spacing A, A' of holes 4', 5' with respect to process point 3) is dynamically measured and from the determined values the requisite advance is calculated in the computer 103, and electromotive drive 30 is controlled by means of the corresponding signals. The measurement of the reference geometry preferably takes place continuously during the advance and transfer movement of leadframe 1.

As is shown in FIGS. 1, 2 and 3, with the transfer mechanism 70 can be associated a further processing station 65 (dispenser) located upstream of the bonding station 75 in transfer direction X' and provided with opto-electronical measuring sensor 60, and by means of which the process points 3 of the system carrier 1 are pretreated by corresponding agents (epoxy material or the like). Processing station 65 is adjustable by any outside known means to one or other side in the transfer direction, depending on the measurement results.

Process points 3 are pretreated e.g. for the optimum contacting and/or bonding of the electronic components 5 (diagrammatically shown in FIG. 3) to the leadframe 1. A further pretreatment can be constituted by the processing station 65, which can be fed in arrow direction Y (orientation with the particular leadframe) performing a preliminary check, lowering, application of adhesive or marking the process point 3 of leadframe 1.

In a further, not shown embodiment of mechanism 70, as considered in transfer direction X' and behind the processing or bonding station 75, can be provided one or more correspondingly constructed processing stations, in which the leadframes 1 are subsequently checked, marked or cut at corresponding points.

It is pointed out here that the transfer mechanism 70 described hereinbefore in conjunction with apparatus 100 can be used in conjunction with an associated station operated as a checking means for already bonded leadframes 1, which may or may not be provided with electronic components (chips).

There has been disclosed heretofore the best embodiment of the invention presently contemplated. However, it is to be understood that various changes and modifications may be made thereto without departing from the spirit of the invention.

What is claimed is:

1. Method for supplying and loading strip-like workpieces, such as metal leadframes, with electronic components, comprising moving said leadframes by a transfer mechanism provided with clamping elements for clamping leadframes to a processing or bonding station, in which electrical circuits for electronic components, such as chips located at process points of said leadframes, are bonded, the method further comprising the steps of:
   a) supplying individual leadframes to a transfer mechanism provided with a first group of movable clamping elements and a second group of fixed clamping elements,
   b) transferring the leadframes by said movable clamping elements to the processing or bonding station by means of an electromotive drive operatively connected to said movable clamping elements by means of a guide unit and a carrier member,
   c) controlling the electromotive drive in a first phase of transfer by data, for the advance of the leadframes to the processing and bonding station, forming a reference geometry dependent on a particular leadframe being processed relative to a position of the process point and a reference hole of each leadframe,
   c) dynamically and opto-electronically measuring reference geometries of the individual leadframes, and
   e) forming in a second phase of transfer corresponding pulses from the determined data for controlling the electromotive drive.

2. Method according to claim 1, wherein the electromotive drive is operated and controlled by a computer and a corresponding associated actuator as a function of given, stored, dynamically or opto-electronically determined reference geometry data and pulses formed therefrom.

3. Method according to claim 1, wherein during said transferring step to the processing or bonding station by means of the movable clamping elements, the leadframes are transferred to further clamping elements fixed on a main carrier substantially oriented in a transfer direction extending at a side plane-oriented angle α, and at at least one point located upstream of the processing or bonding station, the leadframes are aligned in a plane (Y) oriented approximately at right angles to the transfer direction (X').

4. Method according to claim 3, wherein:
   a) during said transferring step and before reaching a first processing station, the leadframes are opto-electronically measured by at least one second processing station,
   b) said second processing station is adjusted to one or other side approximately in the transfer direction (X') depending on measurement results,
   c) the leadframes are pretreated in the second processing station by preliminary controlled, lowering or marking at the processing points, and
   d) the leadframes are checked, marked and cut in at least one further processing station following the processing or bonding station.

5. Method according to claim 1, further comprising the step of providing the transfer mechanism with a correspondingly constructed and positioned processing station or checking the leadframes provided with circuits or components already bonded in another process.

6. Apparatus for supplying and loading strip-like workpieces, such as metal leadframes, comprising:
   a transfer mechanism for transferring leadframes to at least one bonding station for bonding electric circuits and electronic components arranged at a process point of each of individual leadframes;
   a) first group and a second group of clamping elements, the first group of clamping elements being displaceable in a transfer direction (X') relative to the second group of clamping elements, said clamping elements in said second group being fixed;
   b) an electromotive drive and a guide unit operatively connected thereto for a substantially linearly oriented transfer (X') of the leadframes to the bonding station;
   c) a sensor for a dynamic measurement of reference geometries of individual leadframes;
   d) a computer operatively connected to said sensor for converting values determined by the sensor into corresponding signals;
   e) an actuator connected to said electromotive drive and to said computer for using the signals and controlling the electromotive drive for the linearly oriented transfer movement (X'); and
   f) a position checking an control unit interconnected between said actuator and said computer for determining an instantaneous position of elements adjustable in a linear reaction (X') for forming a comparison output for controlling the electromotive drive.

7. Apparatus according to claim 6, and further comprising a processing station for performing a preliminary check on the individual leadframes, said station being located upstream of said processing bonding station in the transfer direction (X) and being provided with a sensor.

8. Apparatus according to claim 7, wherein the transfer mechanism comprises a main carrier oriented in transfer direction (X') for receiving the fixed clamping elements and the guide unit has a carrier member arranged thereon for receiving the displaceable clamping elements and the electromotive drive operatively connected to the guide unit, and said displaceable clamping elements, together with the carrier member are adjustable and movable relative to the fixed clamping elements for the transfer of the leadframes to the processing and bonding stations.

9. Apparatus according to claim 8, wherein the carrier member is operatively connected to the guide unit, and with the clamping elements arranged thereon is adjustable and displaceable by an angle ($\alpha$), in the range of microns in a side plane relative to a web of the main carrier carrying the fixed clamping elements in the transfer direction (X').

10. Apparatus according to claim 6, wherein a positioning device is provided which is associated with at least one fixed clamping element arranged in the vicinity of the bonding station, but with all the fixed clamping elements, said positioning device being constructed to orient individual leadframes approximately orthogonally to a clamping movement.

11. Apparatus according to claim 6, wherein each clamping element of each group has a clamping body arranged between a first casing part and a second casing part each provided with a first clamping face and a second clamping face and being operatively connected on either side to pressure elements, said second clamping face being subdivided by a recess into two clamping face portions and being provided with lateral sliding skids, said first clamping face being constructed as a planar surface with lateral sliding skids.

12. Apparatus according to claim 10, wherein said positioning device comprises at least one positioning element and a spring element and an energy source, said positioning element being movable at right angles to the transfer direction of the leadframes counter to a restoring force of the spring element and operatively connected to said energy source, said positioning element including two spaced-apart legs for assembly with a corresponding clamping element, said legs having ski-like sliding faces, oriented in the transfer direction of the leadframes.

13. Apparatus according to claim 6, further including bonding means, said transfer mechanism being associated with said bonding means, said bonding means including a bonding head movable to the bonding station or the leadframe, said transfer mechanism comprising a main carrier, said first and second groups of clamping elements, the electromotive drive, the guide unit, the bonding station, the computer, the actuator and a position controller all assembled in a subassembly.

14. The apparatus according to claim 6, wherein said first and second group of clamping elements are pneumatically operated.

15. The apparatus according to claim 6, wherein said first and second group of clamping elements are hydraulically operated.

16. The apparatus according to claim 10, wherein said positioning device is electromagnetically operated.

17. The apparatus according to claim 10, wherein said positioning device is pneumatically operated.

18. The apparatus according to claim 10, wherein said positioning device is hydraulically operated.

19. The apparatus according to claim 10, wherein said positioning device is constructed to orient the individual leadframes approximately at right angles to the transfer direction (X').

20. The apparatus according to claim 12, wherein said energy source is electric.

21. The apparatus according to claim 12, wherein said energy source is pneumatic.

22. The apparatus according to claim 12, wherein said energy source is hydraulic.

* * * * *